(12) United States Patent
Park

(10) Patent No.: US 8,119,439 B2
(45) Date of Patent: Feb. 21, 2012

(54) METHODS OF MANUFACTURING AN IMAGE SENSOR HAVING AN AIR GAP

(75) Inventor: Byung-Jun Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 42 days.

(21) Appl. No.: 12/656,584

(22) Filed: Feb. 4, 2010

(65) Prior Publication Data

US 2010/0203665 A1  Aug. 12, 2010

(30) Foreign Application Priority Data

Feb. 9, 2009  (KR) .................. 10-2009-0010345

(51) Int. Cl.
*H01L 21/00* (2006.01)

(52) U.S. Cl. ............... 438/72; 438/69; 438/57; 438/48; 257/E21.04

(58) Field of Classification Search .............. 438/69–72; 257/431, 432, E21.04
See application file for complete search history.

(56) References Cited

U.S. PATENT DOCUMENTS

| | | | |
|---|---|---|---|
| 5,565,676 A * | 10/1996 | Tanabe et al. ................ | 250/340 |
| 7,012,240 B2 | 3/2006 | Yaung | |
| 7,531,884 B2 * | 5/2009 | Kim .............................. | 257/440 |
| 2004/0157165 A1 * | 8/2004 | Oh ................................ | 430/313 |
| 2005/0285215 A1 * | 12/2005 | Lee et al. ...................... | 257/432 |
| 2006/0068586 A1 * | 3/2006 | Pain .............................. | 438/643 |
| 2007/0001100 A1 | 1/2007 | Hsu et al. | |
| 2008/0173963 A1 | 7/2008 | Hsu et al. | |
| 2008/0191296 A1 * | 8/2008 | Wang et al. ................... | 257/432 |
| 2010/0096718 A1 * | 4/2010 | Hynecek et al. ............. | 257/460 |

FOREIGN PATENT DOCUMENTS

| | | |
|---|---|---|
| JP | 2007-013147 | 1/2007 |
| JP | 2008-182185 | 8/2008 |
| KR | 10-2008-0049004 | 6/2008 |
| KR | 10-2008-0069901 | 7/2008 |

OTHER PUBLICATIONS

H. Rhodes et al. "CMOS Imager Technology Shrinks and Image Performance," Microelectronics and Electron Devices, 2004 IEEE Workshop, 2004, p. 7-18.

E.D. Palik, Handbook of Optical Constants of Solids, 1985, Academic Press Orlando (front page only).

T.H. Hsu et al., "A High-efficiency CMOS Image Sensor with Air Gap in Situ MicroLens (AGML) Fabricated by 0.18-μm CMOS Technology," Electron Device Letters, IEEE, 2005, p. 634-636.

(Continued)

*Primary Examiner* — Alexander Ghyka
*Assistant Examiner* — Leonard Chang
(74) *Attorney, Agent, or Firm* — Harness, Dickey & Pierce

(57) ABSTRACT

In an example embodiment, the method of manufacturing an image sensor includes forming an interlayer dielectric (ILD) on a substrate. The substrate may have a plurality of pixels arranged thereon and each of the pixels includes a photoelectric conversion device configured to sense external light and generate photo charges. Furthermore, the method may include forming a metal on the ILD and removing portions of the metal to form a reflection pattern. Additionally, the method may include removing the ILD to a depth to form a trench adjacent to the reflection pattern and forming an air gap in the trench by forming oxide over the substrate such that the reflection pattern and the upper portion of the trench are covered.

20 Claims, 14 Drawing Sheets

OTHER PUBLICATIONS

D.N. Yaung et al., "Air-gap Guard Ring for Pixel Sensitivity and Crosstalk Improvement in Deep Sub-Micron CMOS Image Sensor," IEDM Tech. Dig, 2003, p. 1-16.

T.H. Tsu et al., Dramatic Reduction of Optical Crosstalk in Deep-Submicrometer CMOS Imager with Air Gap Guard Ring, Electron Device Letters, IEEE, 2004, p. 375-377.

T.H. Tsu et al., Color Mixing Improvement of CMOS Image Sensor with Air-Gap-Guard Ring in Deep-Submicrometer CMOS Technology, Electron Device Letters, IEEE, 2005, p. 301-303.

T.H. Tsu et al., "Light Guide for Pixel Crosstalk Improvement in Deep Submicron CMOS Image Sensor," Electron Device Letters, IEEE, 2004, p. 22-24.

* cited by examiner

METHODS OF MANUFACTURING AN IMAGE SENSOR HAVING AN AIR GAP

CROSS-REFERENCE TO RELATED APPLICATION

This application claims the benefit of priority under 35 U.S.C. §119 from Korean Patent Application No. 10-2009-0010345, filed on Feb. 9, 2009, the disclosure of which is hereby incorporated herein by reference in its entirety by reference.

BACKGROUND

1. Field

Example embodiments relate to a method of manufacturing an image sensor having an air gap, and more particularly, to a method of manufacturing a back-illuminated image sensor in which a light receiving unit is formed on a rear surface. Example embodiments further relate to a method of manufacturing an image sensor in which a reflection pattern is formed on a dielectric layer to improve optical sensitivity of a light receiving unit formed on a rear surface. Additional embodiments relate to a method of manufacturing an image sensor in which a reflection pattern is formed simultaneously with an interconnection pattern. Other embodiments relate to a method of manufacturing an image sensor that may reduce or alternatively prevent optical crosstalk caused by incidence of light reflected by a reflection pattern to an adjacent pixel. Alternative embodiments relate to a method of manufacturing an image sensor having an air gap in which when tilted light is reflected by a reflection pattern and incident to an adjacent cell, the air gap may totally reflect the light and guide the light to a corresponding pixel.

2. Description of Related Art

In general, an image sensor is a photoelectric conversion device configured to sense light and convert the light into an electrical signal. A typical image sensor may include a plurality of pixels arranged in a matrix shape on a semiconductor substrate. Each of the pixels may include a photodiode (PD) and transistors. A semiconductor layer and the PD disposed on the semiconductor substrate may sense external light and generate photocharges. The generated photocharges may be collected in the PD. Also, the transistors may output an electrical signal according to the amount of the generated photocharges.

However, in the case of the image sensor, the generated photocharges may be transmitted to and accumulated in a photoelectric conversion device of an adjacent pixel, thereby causing crosstalk between the pixels.

The crosstalk may be classified into optical crosstalk and electrical crosstalk. The optical crosstalk may occur when incident light passing through a microlens (ML) and a color filter is transmitted to a photoelectric conversion device of an adjacent pixel other than a corresponding pixel due to refraction light refracted by an interlayer dielectric (ILD) having a different refractive index from the incident light or reflection light reflected by a top or lateral surface of a metal interconnection layer. The electrical crosstalk may occur when charges generated by a lower or lateral portion of a photoelectrical conversion unit are transmitted to a photoelectric conversion device of an adjacent pixel due to incident light having a long wavelength.

When crosstalk occurs, a black-and-white image sensor may suffer from image distortion due to its low resolution. Also, a color image sensor, which uses a color filter array (CFA) having red, green, and blue filters, may be highly likely to suffer from crosstalk due to red incident light having a long wavelength, thereby causing tint failures. Also, blooming may occur between adjacent pixels on a screen.

Image sensors have recently shown an increasing tendency to become highly integrated. Thus, a distance between pixels and the size of PDs is also decreasing. Thus, with an increase in the integration density of image sensors, crosstalk may become more problematic.

SUMMARY

Example embodiments provide a method of manufacturing a back-illuminated image sensor in which light is incident to a rear surface without passing through a plurality of interconnection layers disposed on a front surface. The back-illuminated image sensor may include a reflection pattern, which may reflect light transmitted through a dielectric layer of an interconnection layer and condense light on a photodiode (PD).

Example embodiments also provide a method of manufacturing an image sensor in which a reflection pattern is formed integrally with an electrical circuit interconnection on the same plane as the electrical circuit interconnection.

Example embodiments further provide a method of manufacturing an image sensor having an air gap functioning as a light guide. In this method, formation of the air gap may include removing a dielectric layer to a desired (or alternatively predetermined) depth using a reflection pattern and an interconnection pattern as an etch mask to form a trench, and filling only an upper portion of the trench using oxide having a poor gap-fill characteristic.

Example embodiments further provide a method of manufacturing an image sensor in which light reflected by a reflection pattern and incident to an adjacent pixel may be cut off to improve long-wavelength sensitivity and reduce or alternatively prevent crosstalk.

According to example embodiments, a method of manufacturing an image sensor includes preparing a semiconductor substrate on which a plurality of pixels are arranged. Each pixel includes a photoelectric conversion device configured to sense external light and generate photocharges. An interlayer dielectric (ILD) may be formed on the semiconductor substrate. A metal may be deposited on the ILD and removed to form a reflection pattern, an interconnection pattern, and a dummy pattern. The reflection pattern may reflect light to allow light passing through the photoelectric conversion device to be reabsorbed in the photoelectric conversion device. The interconnection pattern may function as an electrical circuit interconnection in a lengthwise direction of the reflection pattern. The dummy pattern may not function as an electrical circuit interconnection in a widthwise direction of the reflection pattern. The ILD may be removed to a depth corresponding to the surface of the semiconductor substrate using the reflection pattern, the interconnection pattern, and the dummy pattern as an etch mask, thereby forming a trench between the reflection pattern and the interconnection pattern or between the reflection pattern and the dummy pattern. An may be deposited on the reflection pattern, the interconnection pattern, and the dummy pattern between which the trench is formed until only an upper portion of the trench is filled with the oxide, thereby forming an air gap in the ILD. The air gap functions as a light guide to reduce or alternatively prevent light reflected by the reflection pattern from being incident to an adjacent pixel.

The silicon substrate may include a heavily doped P$^+$ region and a P-epitaxial region which are sequentially stacked. An N-type impurity region may be formed under the surface of the Si substrate using a deep ion implantation process, and a P-type impurity region may be formed to contact the surface of the Si substrate.

removing the ILD to the depth corresponding to the surface of the semiconductor substrate may include forming an etch stop layer between the Si substrate and the ILD to prevent the etching of the Si substrate. The trench may be formed to a depth corresponding to the surface of the etch stop layer.

The reflection pattern may be formed in a box-and-space (B/S) type, the interconnection pattern may be formed in a line-and-space (L/S) type in the lengthwise direction of the reflection pattern, and the dummy pattern may be formed in an isolation type in the widthwise direction of the reflection pattern and also formed in an L/S type.

Removing the ILD may include forming a hard mask formed of SiN on the reflection pattern, the interconnection pattern, and the dummy pattern to reduce or alternatively prevent metal loss.

The gap-fill oxide may be an oxide layer formed of plasma-enhanced oxide (PEOX) or plasma-enhanced tetra ethyl ortho silicate (PE-TEOS), which has a poor step coverage characteristic not to bury the trench.

The method may further include forming an inter-metal dielectric (IMD) on the oxide, forming the metal layer using aluminum (Al), copper (Cu), or tungsten (W) on the IMD, and patterning the metal layer using photolithography and etching processes. The method may further include attaching a sustain wafer formed of Si onto a front surface of the Si substrate to process a rear surface of the Si substrate and back-lapping the rear surface of the Si substrate according to design implications using the sustain wafer. Thereafter, an anti-reflective layer (ARL) may be formed on the back-lapped rear surface of the Si substrate. Color filters may be formed on the ARL, and microlenses (MLs) for condensing light may be installed on the color filters.

According to another example embodiment, a method of manufacturing an image sensor. The method includes arranging a plurality of pixels on a semiconductor substrate including an epitaxial layer. Each pixel includes a photoelectric conversion device. An ILD may be formed on the semiconductor substrate. A metal may be deposited on the ILD and removed to form a reflection pattern, an interconnection pattern, and a dummy pattern. The reflection pattern may reflect light to allow light passing through the photoelectric conversion device to be reabsorbed in the photoelectric conversion device. The interconnection pattern functions as an electrical circuit interconnection in a lengthwise direction of the reflection pattern. The dummy pattern may not function as an electrical circuit interconnection in a widthwise direction of the reflection pattern. The reflection pattern may be formed in a box-and-space (B/S) type, the interconnection pattern may be formed in a two-line-and-space (2L/S) type in the lengthwise direction of the reflection pattern, and the dummy pattern is formed in an isolation type in the widthwise direction of the reflection pattern and also formed in a 2L/S type. An inter-metal dielectric (IMD) may be formed on the ILD having the reflection pattern, the interconnection pattern, and the dummy pattern. Photoresist (PR) may be coated on the IMD and a space may be opened between two lines in at least the interconnection pattern and the dummy pattern to form a single trench for separating adjacent unit pixels from each other. An oxide may be deposited on the IMD having the single trench until only an upper portion of the trench is filled with the oxide, thereby forming an air gap in the ILD. The air gap functions as a light guide to reduce or alternatively prevent light reflected by the reflection pattern from being incident to an adjacent pixel.

The air gap may be formed to a width of less than about 0.5 µm to enhance a gap-fill characteristic and formed to a width of at least 0.05 µm to enable total reflection.

According to another example embodiment, a method of manufacturing an image sensor. The method includes forming an ILD on a substrate. The substrate having a plurality of pixels arranged thereon, and each of the pixels including a photoelectric conversion device configured to sense external light and generate photo charges. Additionally, a metal may be formed on the on the ILD and the metal may be removed to form a reflection pattern. The ILD may be removed to a depth to form a trench adjacent to the reflection pattern and a gap-filled oxide may be deposited on the reflection pattern.

BRIEF DESCRIPTION OF THE DRAWINGS

Exemplary embodiments will be more clearly understood from the following detailed description of the embodiments taken in conjunction with the accompanying drawings in which.

DETAILED DESCRIPTION OF THE EMBODIMENTS

Figure 1:
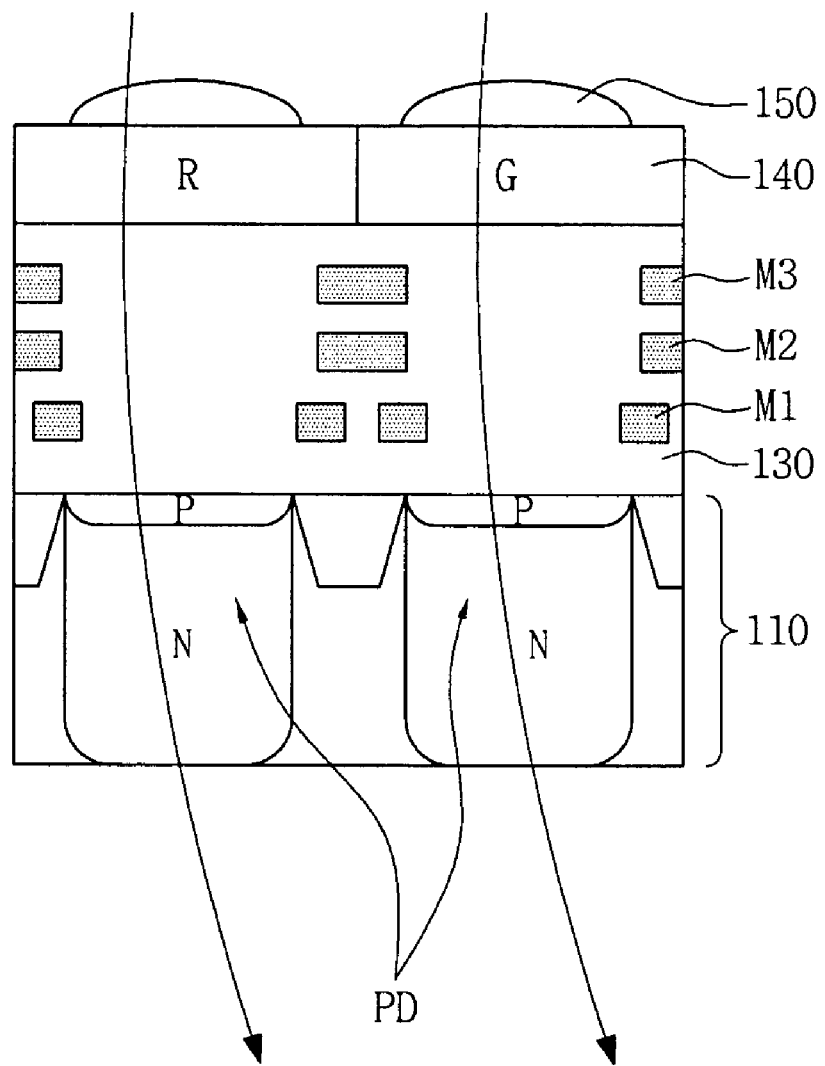
FIG. 1 is a cross-sectional view of a front-illuminated image sensor according to an example embodiment.

Example embodiments of the present invention will be more clearly understood from the detailed description taken in conjunction with the accompanying drawings.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

Hereinafter, a method of manufacturing an image sensor in which an air gap may be formed by filling only an upper portion of a dielectric trench with gap-fill oxide in order to improve optical crosstalk according to example embodiments will be described with reference to the appended drawings.

An image sensor according to example embodiments may be divided into an active pixel sensor (APS) area in which a plurality of unit pixels are arranged in a matrix shape and a peripheral circuit area (or peri area) in which a peripheral circuit is formed to control the unit pixels or process signals of the unit pixels. Also, the APS area may be divided into a photoelectric conversion device configured to convert light energy into an electrical signal and a logic device configured to process the electrical signal and generate data.

The photoelectric conversion device may absorb incident light energy and accumulate generated charges. The photoelectric conversion device may be, but is not limited to, a photodiode (PD). Thus, any device capable of converting light energy into an electrical signal, such as a photo-transistor, may be used as the photoelectric conversion device. In example embodiments, it is assumed that the photoelectric conversion device is a PD.

The logic device may include a plurality of MOS transistors, which may include a transfer transistor, a reset transistor, a drive transistor, and a select transistor. The transfer transistor may transfer photocharges collected in the PD to a floating diffusion region. The reset transistor may set the floating diffusion region at a desired electric potential and emit charges to reset the floating diffusion region. The drive transistor may function as a source follower buffer amplifier. The select transistor may function as a switch and addressing.

Hereinafter, construction of an image sensor having a photoelectric conversion device will be described in detail.

An image sensor 100 of FIG. 1 may be a front-illuminated image sensor.

Referring to FIG. 1, a dielectric layer 130 required for forming a metal line may be formed on a front surface of a silicon (Si) substrate 110 having PDs. A plurality of metal lines M1, M2, and M3 functioning as interconnections may be formed in the dielectric layer 130. In this case, the dielectric layer 130 may include a plurality of interlayer dielectrics (ILDs) in a number proportional to the stacked number of the metal lines M1, M2, and M3. Although not shown, ILDs D1, D2, and D3 may be formed in a number corresponding to the metal lines M1, M2, and M3.

Color filters 140 for embodying red (R), green (G), and blue (B) may be formed on the dielectric layer 130 in respective unit pixels. Microlenses (ML) 150 for condensing light may be installed on the color filters 140.

Thus, incident light may be focused by the ML 150 to reach the PD. Since the image sensor 100 according to example embodiments is the front-illuminated image sensor in which the interconnection layer patterns and the ML 150 are formed on the front surface, incident light through the ML 150 should pass between interconnection layer patterns of the metal lines M1, M2, and M3 to reach a light receiving unit, that is, the PD. But, incident light may be absorbed in dielectric layer 130 and/or reflected by these patterns.

Figure 2:
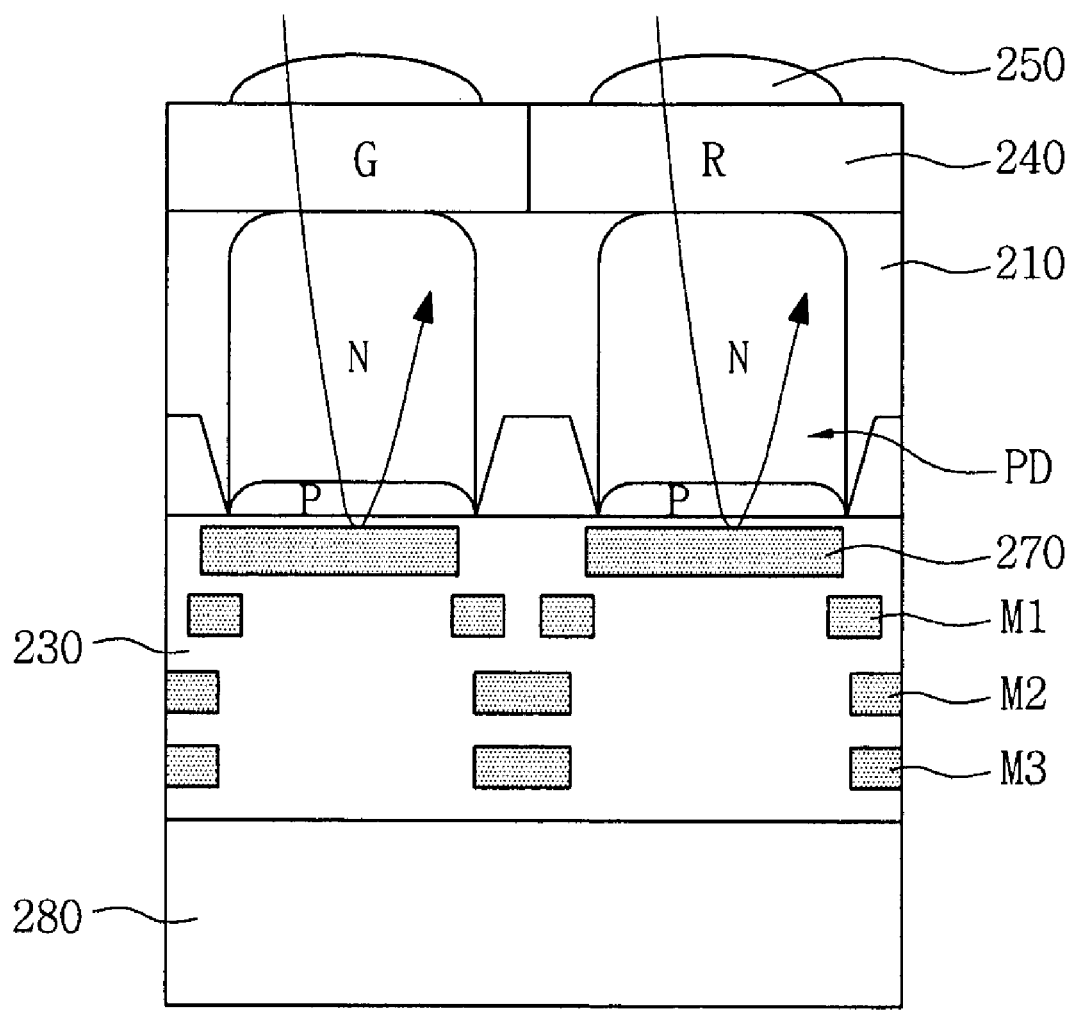
FIG. 2 is a cross-sectional view of a back-illuminated image sensor including a reflection plate according to another example embodiment.

In order to overcome the above-described drawback, a back-illuminated image sensor 200 according to other example embodiments may be proposed as shown in FIG. 2. The back-illuminated image sensor 200 may be configured such that when light is irradiated from a rear surface of a Si substrate 210 on the reverse side of an interconnection unit, the light passes through an ML 250 and a color filter 240 and may be sensed by a light receiving unit. Therefore, the incident light may not be interfered with by the layout of metal lines M1, M2, and M3 of the interconnection unit at all.

However, even the back-illuminated image sensor 200 may have the following problems. The absorptance coefficient of light should vary with the wavelength λ thereof. Thus, as the wavelength λ of light increases, the depth of the Si substrate 210 should increase. However, the increase in the depth of Si may run counter to a growing tendency for semiconductor devices to become more lightweight, thinner, simpler, and smaller. Furthermore, with a reduction in the size of pixels, forming PDs in a deep region using an ion implantation process becomes more difficult. Additionally, the amount of absorbed light may decrease, and the sensitivity of a light receiving unit may be degraded in proportion to the amount of the absorbed light. As a result, a signal to noise ratio (SNR) may deteriorate.

Accordingly, when light is irradiated from the rear surface of the Si substrate 210, the irradiated light may not be totally converged on a light receiving unit but directly transmitted through the light receiving unit and emitted to the front surface of the Si substrate 210 in the long-wavelength range, for example, in the visible light region. Thus, since long-wavelength light to be converged on the light receiving unit is lost, the sensitivity of the light receiving unit may be greatly degraded.

Therefore, as shown in FIG. 2, a reflection plate 270 may be formed in a dielectric layer 230 such that light passing through a PD may be reflected and condensed again in the PD. Specifically, with the downscaling of pixels, there is a specific technical limit to increasing the thickness of the Si substrate 210 according to design implications. In particular, since the PD cannot be formed to a great depth from the surface of the Si substrate 210 due to the limitations of an ion implantation process, the PD may be and typically is formed in the surface of the Si substrate 210. Thus, incident light may not be absorbed in the PD but mostly lost due to the long wavelength range. As a result, formation of the reflection plate 270 is desired or alternatively absolutely required to reabsorb unabsorbed light. In addition, a sustain wafer 280 formed of a Si material may be provided on dielectric layer 230 to facilitate the processing of the rear surface of the Si substrate 210.

In order to embody a high-resolution image sensor, a pixel area is gradually decreasing. Thus, crosstalk between adjacent pixels may greatly increase.

Figure 3:
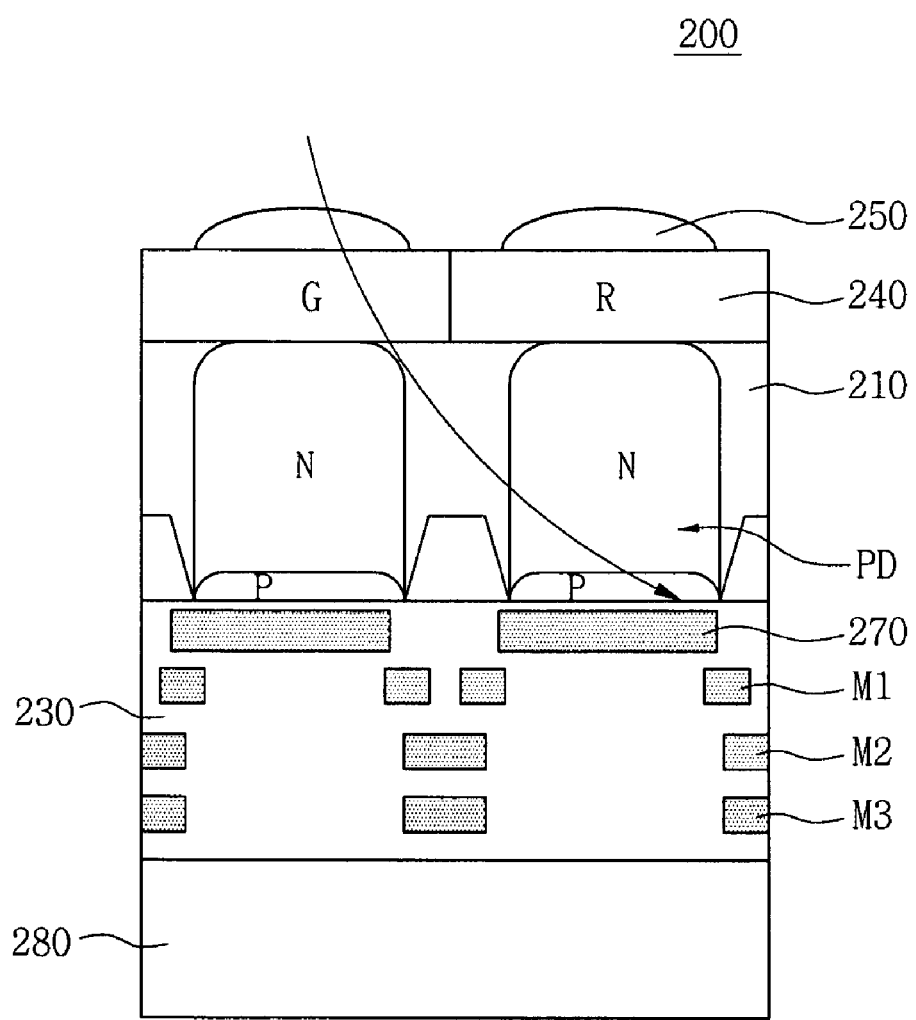
FIG. 3 is a cross-sectional view of crosstalk incident at a tilt angle according to another example embodiment.
Figure 4:
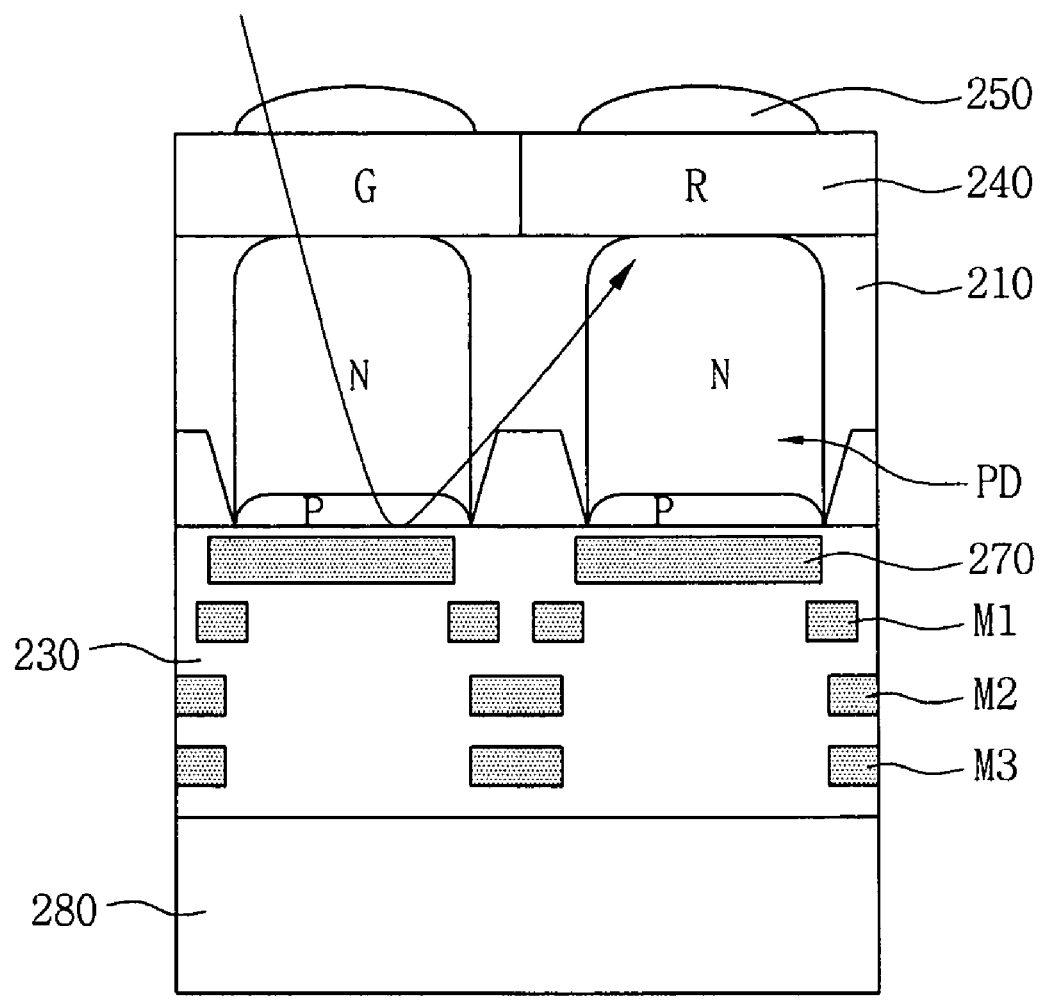
FIG. 4 is a cross-sectional view of crosstalk reflected by a reflection plate according to another example embodiment.

The crosstalk may result from the movement of electrons generated in the semiconductor substrate 210 due to a photoelectric effect caused by light energy. Also, the crosstalk may occur due to light incident at a tilt angle as shown in FIG. 3 or light reflected by the reflection plate 270 as shown in FIG. 4. Electrical crosstalk due to the movement of the electrons generated due to the photoelectric effect may be minimal. However, optical crosstalk due to light incident at a tilt angle from an adjacent pixel or light reflected by the reflection plate 270 may be problematic. In particular, since the reflection plate 270 may be provided to improve condensing efficiency of the back-illuminated image sensor 200, crosstalk caused by light reflected by the reflection plate 270 and incident to an adjacent pixel may worsen.

The crosstalk may lead to data mixing between pixels, thus causing color mixing. In particular, when a bright image of a desired region may be captured, even the surrounding area of the desired region may look bright. Thus, it is difficult to capture a clear image.

Figure 5:
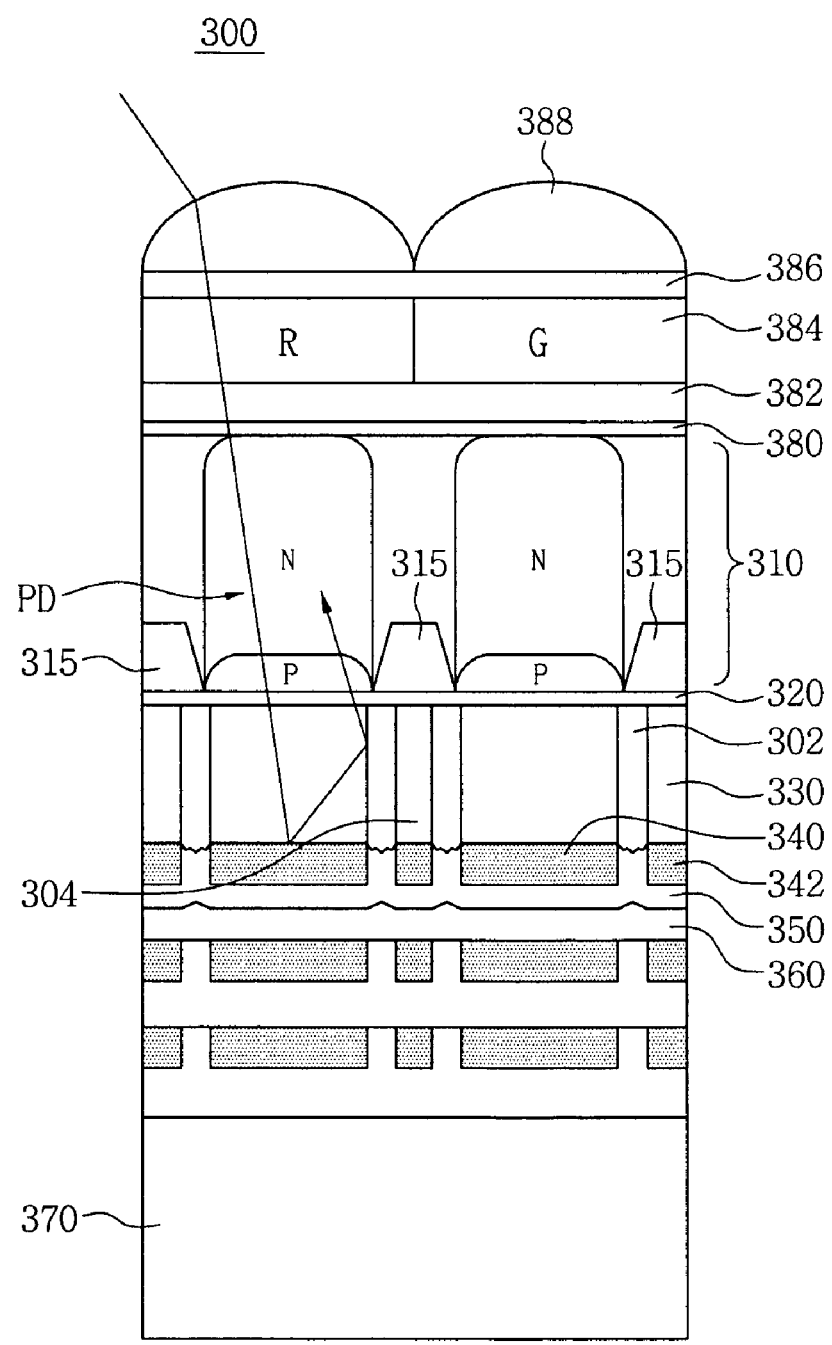
FIG. 5 is a cross-sectional view of crosstalk improved due to an air gap according to still another example embodiment.

According to other example embodiments, as shown in FIG. 5, an air gap 302 may be formed to reduce or alternatively prevent light reflected by a reflection plate formed on a dielectric layer from being incident to an adjacent pixel.

The air gap 302 may partially or alternatively totally reflect light incident at a tilt angle to reduce or prevent optical crosstalk. A refractive index may vary according to a medium. For example, oxide constituting the dielectric layer 230 may have a higher refractive index than air in the air gap 302. In this embodiment, when light is irradiated from a medium through which light travels at low speed toward a medium through which light travels at high speed, the light may not pass through the medium through which light travels at high speed but partially or alternatively totally return to the medium through which light travels at low speed. That is, even if light is irradiated from the oxide constituting the dielectric layer 230 toward, the air in the air gap 302; the light may not be incident to the air but totally reflected at the same angle as an incident angle and return to the oxide.

Figure 6:
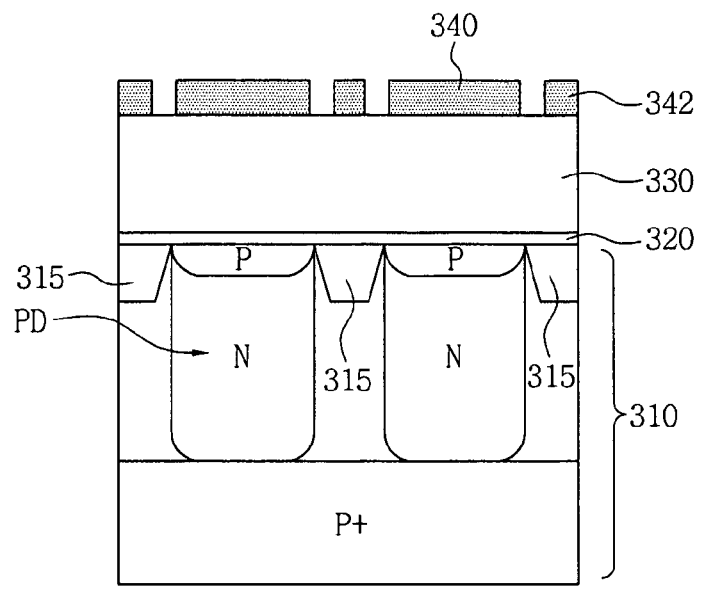
FIG. 6 is a cross-sectional view illustrating a process of forming a reflection pattern and an interconnection pattern according to still another example embodiment.

Referring to FIG. 6, PDs may be formed in the front surface of a Si substrate 310 using an ion implantation process. Each of the PDs may include an N-type impurity region formed under the surface of the Si substrate 310 using a deep ion implantation process and a P-type impurity region formed to contact the surface of the Si substrate 310. That is, the N-type impurity region may be formed under the surface of the Si substrate 310 in which a heavily doped $P^+$ region and a P-epitaxial layer are stacked, and the P-type impurity region may be formed to contact the surface of the Si substrate 310.

In this embodiment, to form isolation regions, the Si substrate 310 may be selectively removed to form trenches and the trenches may be filled with a dielectric layer to form a field oxide layer (not shown). Although not shown, a floating diffusion region may be formed in the same plane as the PDs.

Also, a transfer transistor or a reset transistor may be formed on the front surface of the Si substrate 310 having the PDs.

An etch stop layer 320 may be formed on the front surface of the Si substrate 310 to reduce or alternatively prevent the removing of the PDs during a subsequent process of removing the dielectric layer. An ILD 330 may be formed using an oxide layer or nitride layer on the etch stop layer 320. The oxide layer may be formed of $SiO_2$, P—SiN, or SiON.

A metal may be formed of aluminum (Al), copper (Cu), or tungsten (W) on the ILD 330. The metal may be patterned using photolithography and removing processes, thereby forming a reflection pattern 340 and an interconnection pattern 342.

Figure 7:
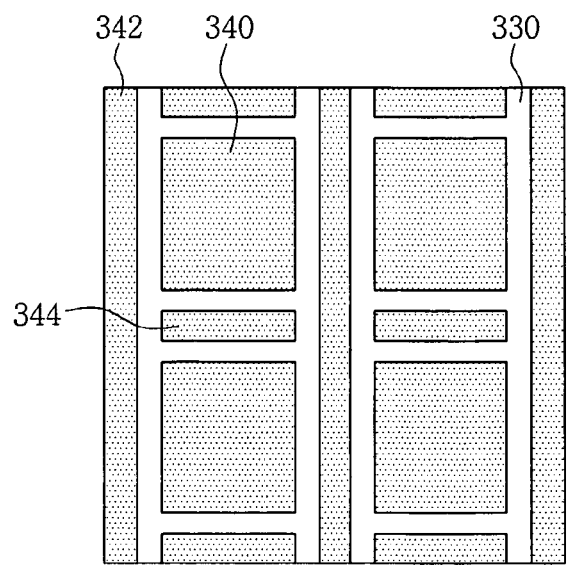
FIG. 7 is a plan view corresponding to the cross-sectional view of FIG. 6.

The interconnection pattern 342 may be used to connect a power line and a signal line with the above-described unit pixel or a logic circuit. The shape, size, or number of the interconnection patterns 342 is not limited. In this embodiment, as shown in FIG. 7, the reflection pattern 340 may be patterned as a box-and-space (B/S) type, and the interconnection pattern 342 may be patterned as a line-and-space (L/S) type.

According to the present example embodiments, a dummy pattern 344 may be further formed in a widthwise direction of the interconnection pattern 342 so that the air gap 302 may be formed in each unit pixel as a ring type to surround the PD. The interconnection pattern 342 functions as an electrical circuit interconnection in a lengthwise direction of the reflection pattern 340. The dummy pattern 344 does not function as an electrical circuit interconnection and may be formed in an isolation type in a widthwise direction of the reflection pattern 340.

Figure 8:
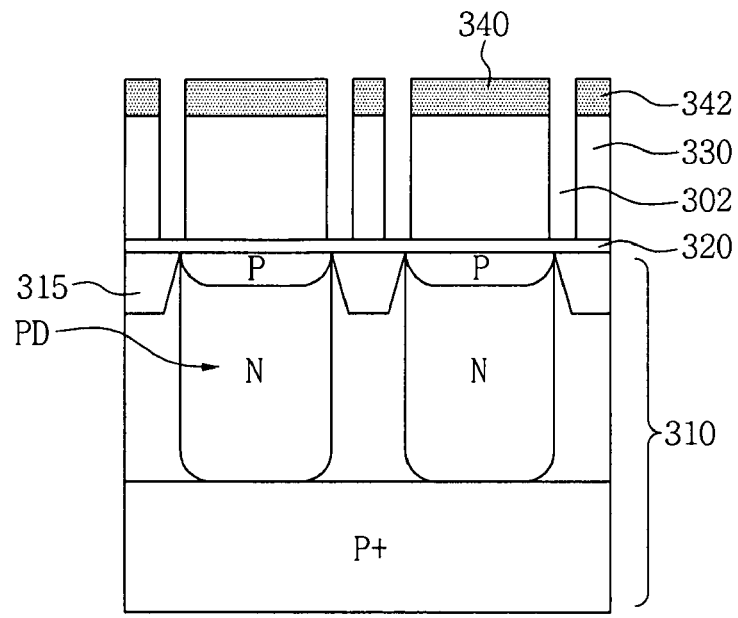
FIG. 8 is a cross-sectional view illustrating a process of etching an interlayer dielectric (ILD) to form a trench according to still another example embodiment.

Referring to FIG. 8, the ILD 330 may be removed to a required or alternatively predetermined depth using the reflection pattern 340, the interconnection pattern 342, and the dummy pattern 344 as an etch mask. Thus, a trench may be formed between the reflection pattern 340 and the interconnection pattern 342 or between the reflection pattern 340 and the dummy pattern 344.

Although not shown, in order to reduce or prevent metal loss during the removing of the ILD 330, a hard mask formed of SiN or other oxide may be further formed on the reflection pattern 340 and the interconnection pattern 342. Also, in order to reduce or prevent the removing of the peri area during the removing of the ILD 330, photoresist (PR) exposing only the APS area may be further formed.

Figure 9:
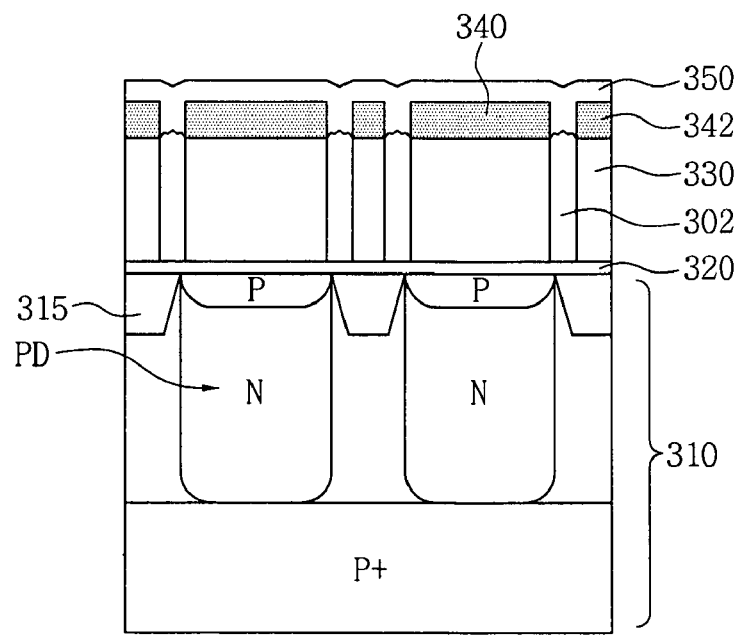
FIG. 9 is a cross-sectional view illustrating a process of filling only an upper portion of the trench with gap-fill oxide according to still another example embodiment.

Referring to FIG. 9, a gap-fill oxide 350 having a high step coverage characteristic may be formed on the reflection pattern 340, the interconnection pattern 342, and the dummy pattern 344 between which the trench is formed, thereby filling only an upper portion of the trench with the gap-fill oxide 350. Thus, a void may be generated in the ILD 330 due to the trench. The void may form the air gap 302, which functions as a light guide to reduce or alternatively prevent light reflected by the reflection pattern 340 from being incident to an adjacent pixel.

The gap-fill characteristic of the gap-fill oxide 350 may be poor. In other words, the aspect ratio of the trench may be increased by reducing the width of the trench compared to the depth of the trench, and the gap-fill oxide 350 having a poor gap-fill characteristic may be formed on the resultant structure having the trench with a high aspect ratio. The gap-fill oxide 350 may be plasma-enhanced oxide (PEOX) or plasma-enhanced tetra ethyl ortho silicate (PE-TEOS). A PEOX or PE-TEOS oxide may be used so that the trench is not buried. In this embodiment, the trench may be formed to a width of less than about 0.5 μm to utilize the poor gap-fill characteristic. In addition, the trench may be formed to a width of at least 0.05 μm so that the trench may be the air gap 302 functioning as a total reflection layer.

Figure 10:
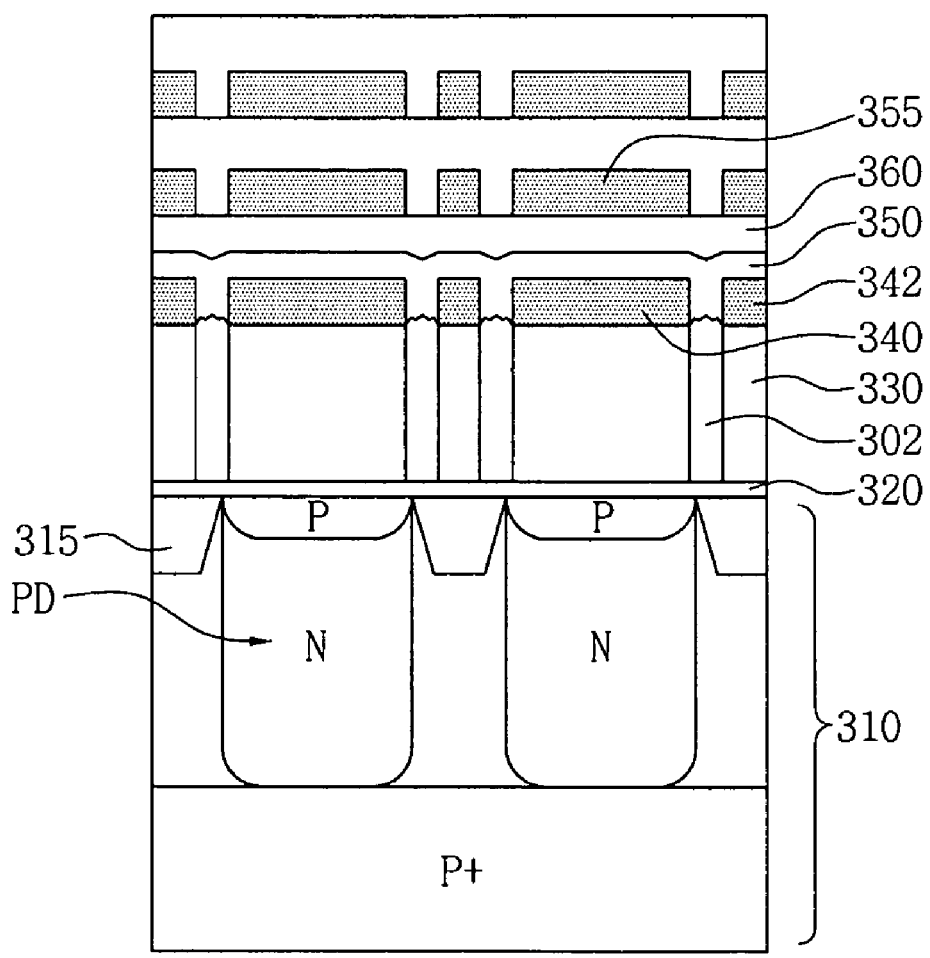
FIG. 10 is a cross-sectional view illustrating a process of forming an interlayer interconnection dielectric layer and each interconnection layer according to still another example embodiment.

Referring to FIG. 10, Inter-metal dielectrics (IMDs) 360 may be formed on the gap-fill oxide 350. Similarly, a metal layer 355 formed of a metal, such as Al, Cu, or W may be formed on the IMDs 360 and patterned using photolithography and removing processes, thereby forming various interconnection patterns (not shown).

Since the reflection patterns 340 or the interconnection patterns 342 are vertically arranged, a process of forming the IMDs 360 and a process of polishing the surface of the IMDs 360 should be repeated as many times as the number of layers of patterns. That is, formation of a multilayered pattern may involve repeating a process of forming the IMDs 360 and a process of planarizing the IMDs 360 as many times as the number of layers of the multilayered pattern. For brevity, the present example embodiments describe that the IMDs 360 has the same pattern shape as the ILD 330, but the shape or function of interconnections patterned on the IMDs 360 is not limited thereto.

Also, each of the reflection pattern 340, the interconnection pattern 342, and the dummy pattern 344 may be not a multiple layer but a single layer. When each of the interconnection pattern 342 is a multiple layer, respective layers of the multiple layer may be connected by vias (not shown).

Figure 11:
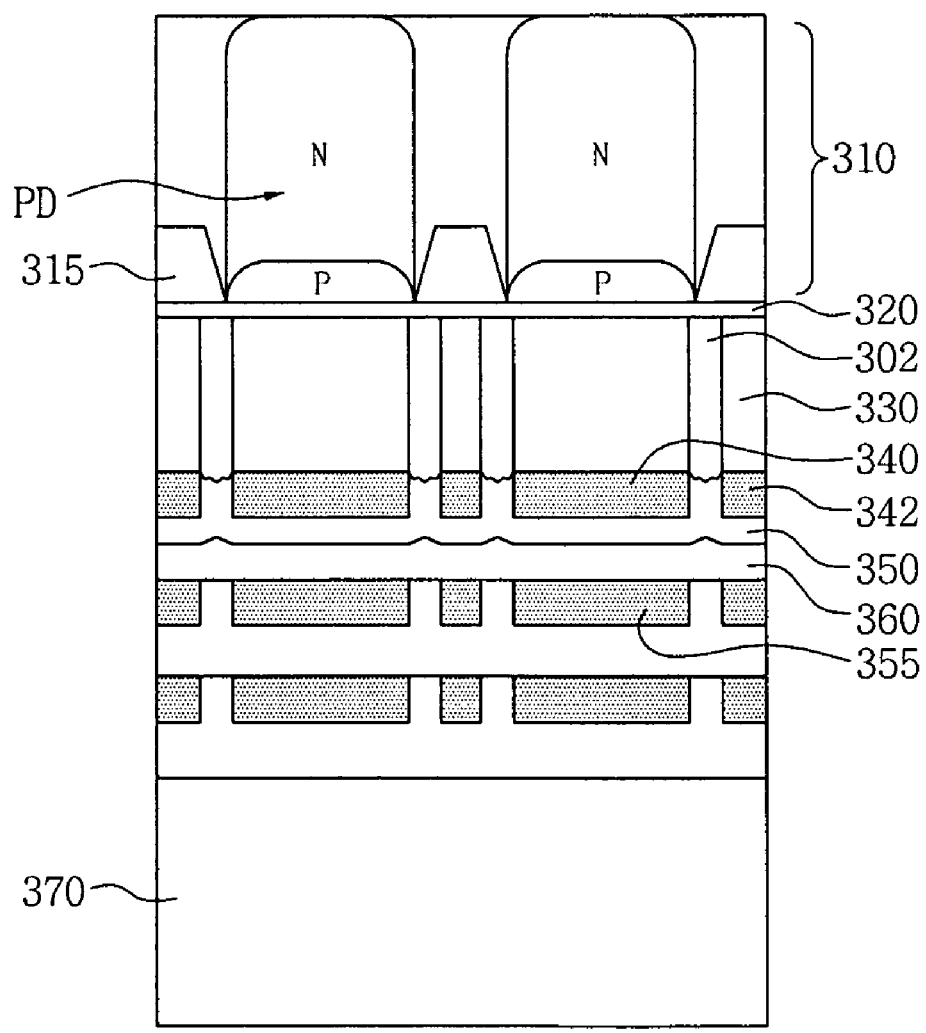
FIG. 11 is a cross-sectional view illustrating a process of attaching a sustain wafer onto a front surface of a silicon (Si) substrate to back-lap a rear surface of the Si substrate according to still another example embodiment.

Referring to FIG. 11, in order to process the rear surface of the Si substrate 310, the Si substrate 310 may be turned upside down such that the front surface of the Si substrate 310 faces downward. A sustain wafer 370 formed of Si or SiO$_2$ may be attached to the front surface of the Si substrate 310 to facilitate the processing of the rear surface of the Si substrate 310. The rear surface of the Si substrate 310 may be back-lapped in order to control the thickness of the Si substrate 310 according to design implications of image sensors. In this embodiment, even if the thickness of the Si substrate 310 is reduced, the Si substrate 310 may not be distorted or damaged due to the sustain wafer 370.

Figure 12:
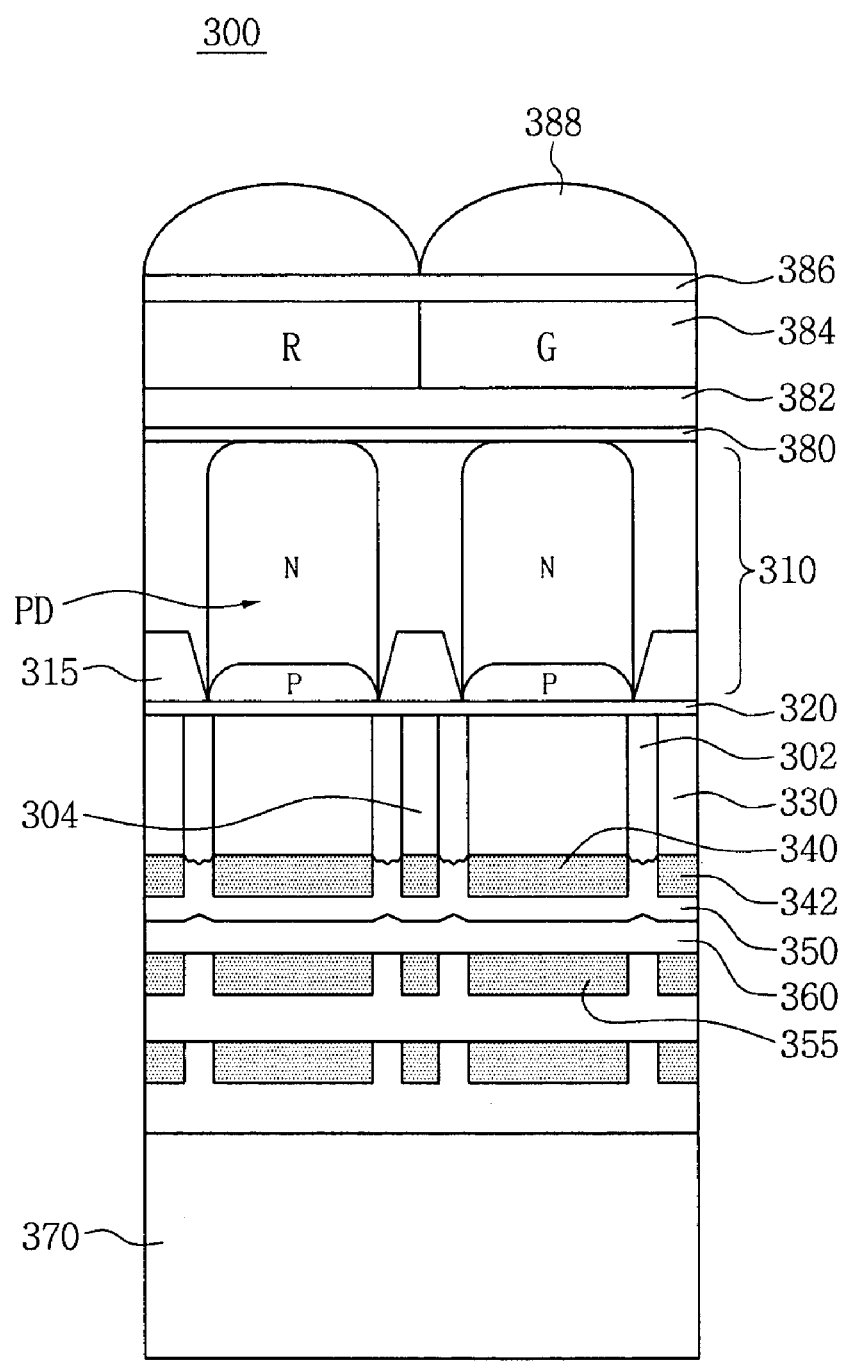
FIG. 12 is a cross-sectional view of an image sensor including an air gap according to still another example embodiment.

Referring to FIG. 12, an anti-reflective layer (ARL) 380 may be further formed on the back-lapped rear surface of the Si substrate 310. Although not shown, a pad metal layer (not shown) may be further formed on the ARL 380. In this embodiment, an oxide 382 may electrically insulate the pad metal layer. Color filters 384 may be formed on the oxide 382. A planarization layer 386 may be formed on the color filters 384, and MLs 388 for condensing light may be installed on the planarization layer 386, thereby completing the manufacture of the image sensor 300.

According to example embodiments, spaces may be provided on both sides of a line of the interconnection pattern 342, so that a buffer area 304 including the ILD 330 may be disposed between the air gaps 302 of unit pixels. The buffer area may cut off light that is not reflected by the reflection pattern 340 of an adjacent pixel but directly incident at a tilt angle. Thus, by the buffer area, crosstalk may be effectively reduced or alternatively prevented. However, because of the buffer area, a pixel size may be reduced.

Figure 19:
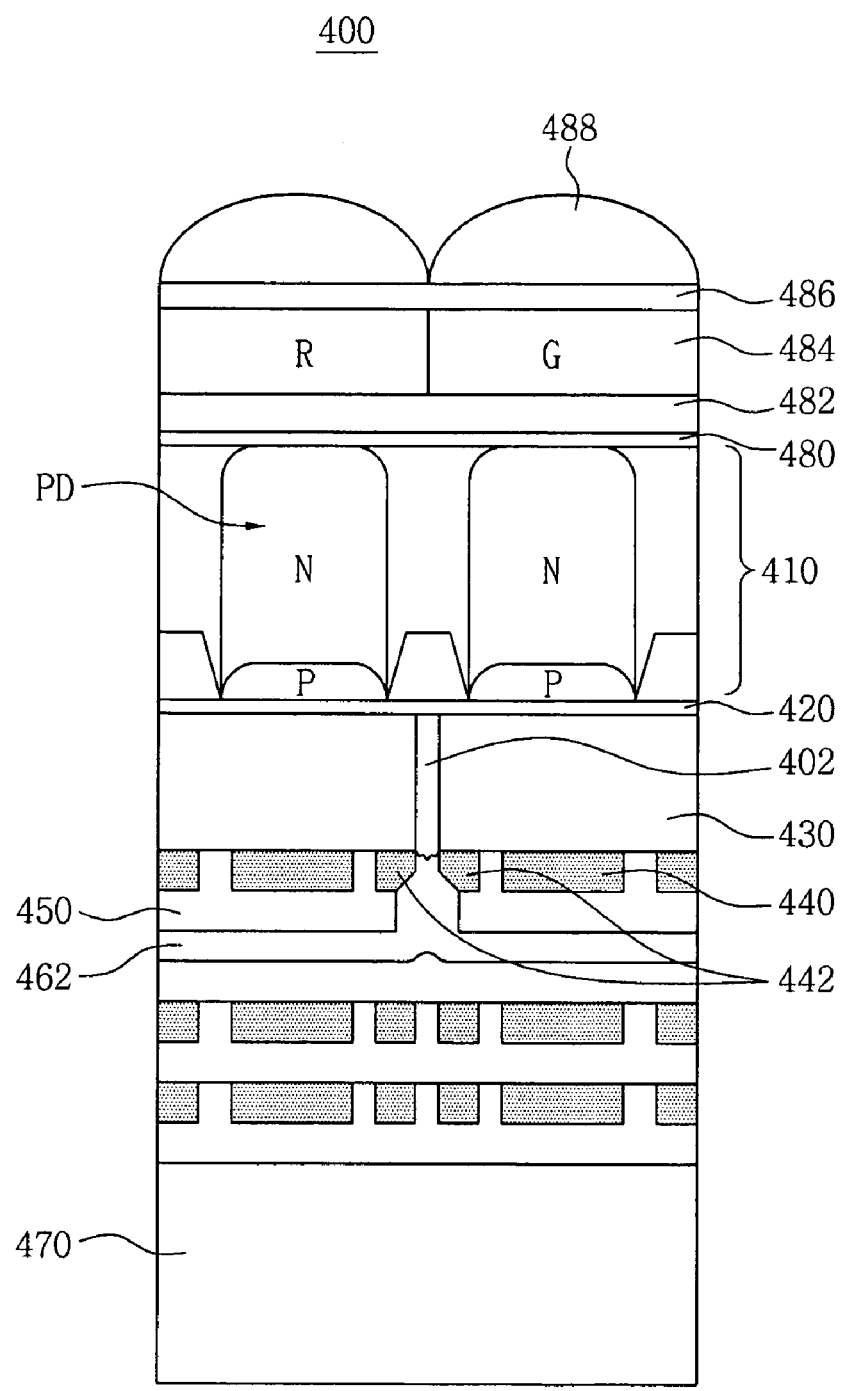
FIG. 19 is a cross-sectional view of an image including an air gap according to yet another example embodiment.

According to other example embodiment as shown in FIG. 19, crosstalk may be reduced or alternatively prevented using a single air gap 402, which separates adjacent unit pixels from each other, without using a buffer area. To do this, like in the above-described example embodiments, a PD may be formed on a front surface of a Si substrate 410 using an ion implantation process, and an etch stop layer 420 may be formed on the Si substrate 410 having the PD. Thereafter, an ILD 430 may be formed using an oxide layer or nitride layer on the etch stop layer 420. The oxide layer may be formed of SiO$_2$, P—SiN, or SiON. After that, a metal may be formed on the ILD 430.

Figure 13:
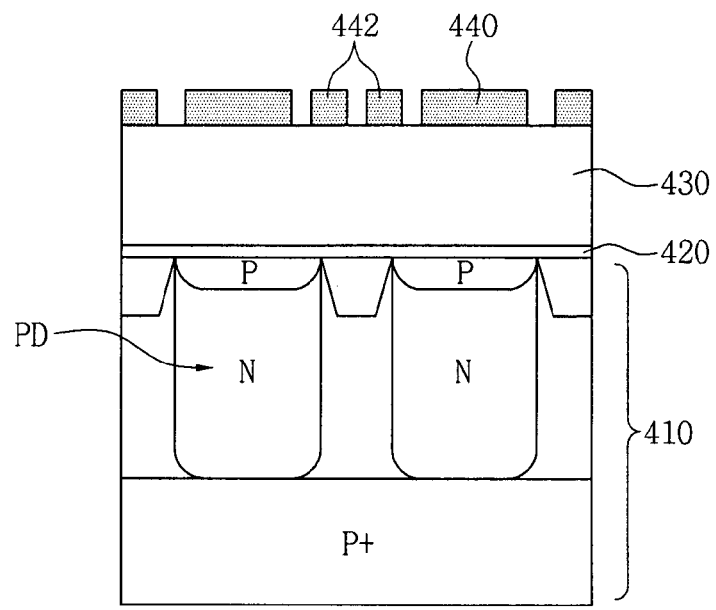
FIG. 13 is a cross-sectional view illustrating a process of forming a reflection pattern and an interconnection pattern according to yet another example embodiment.
Figure 14:
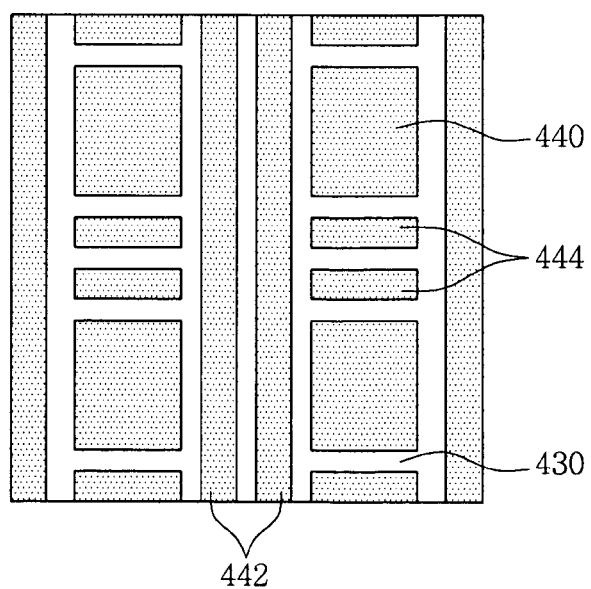
FIG. 14 is a plan view corresponding to the cross-sectional view of FIG. 13.

Referring to FIGS. 13 and 14, when the metal layer is patterned, a reflection pattern 440 may be formed in a B/S type, and an interconnection pattern 442 may be formed in a two-line-and-space (2L/S) type. A dummy pattern 444 may be formed in an isolation type, which may be isolated from the interconnection pattern 442 in a widthwise direction, and also formed in a 2L/S type. At least one of the interconnection patterns 442 may be used as a dummy pattern.

Figure 15:
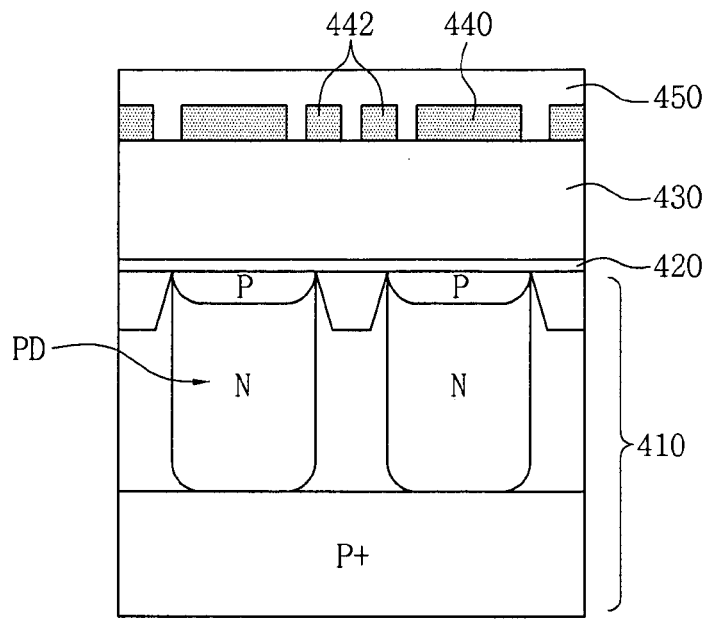
FIG. 15 is a cross-sectional view illustrating a process of forming an interlayer interconnection dielectric layer on a Si substrate including a pattern according to yet another example embodiment.

Referring to FIG. 15, a process of directly removing the ILD 430 using the reflection pattern 440, the interconnection pattern 442, and the dummy pattern 444 as an etch mask may be omitted. This is because an IMD 450 is formed on the patterned ILD 430.

Figure 16:
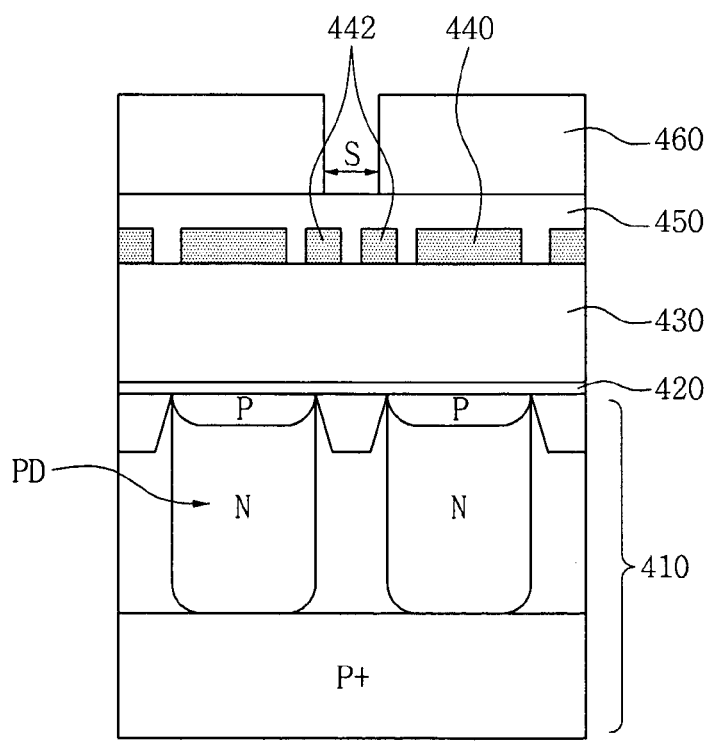
FIG. 16 is a cross-sectional view illustrating a process of depositing and patterning photoresist on the interlayer interconnection dielectric layer according to yet other example embodiment.

Referring to FIG. 16, PR 460 may be coated on the IMD 430. A portion of the PR 460 corresponding to a space S interposed between at least two lines 2L may be exposed such that a trench may be formed between a pair of the interconnection pattern 442 and the dummy pattern 444.

Figure 17:
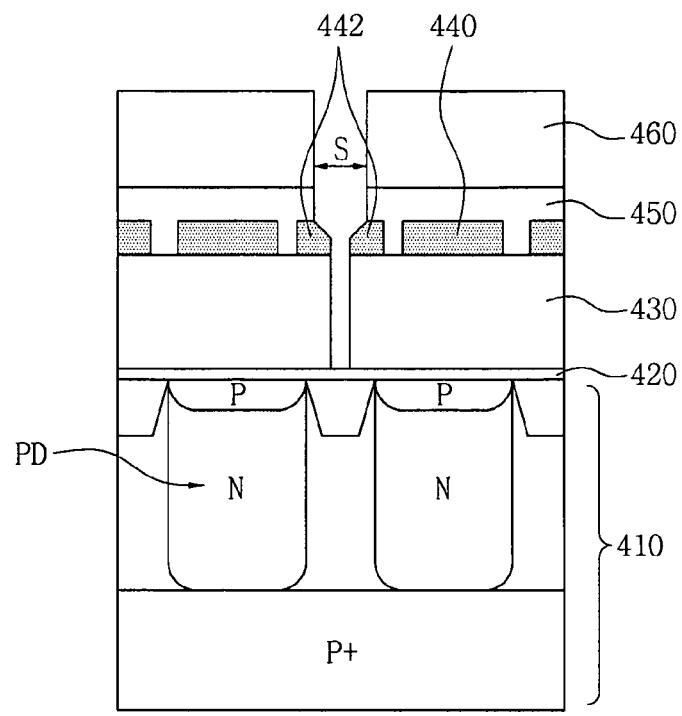
FIG. 17 is a cross-sectional view illustrating a process of etching an ILD to form a trench according to yet another example embodiment.

Referring to FIG. 17, the space S may be removed to a required or alternatively predetermined depth using the PR 460 as an etch mask. Thus, a single trench for separating adjacent unit pixels from each other may be formed in the ILD 430.

Figure 18:
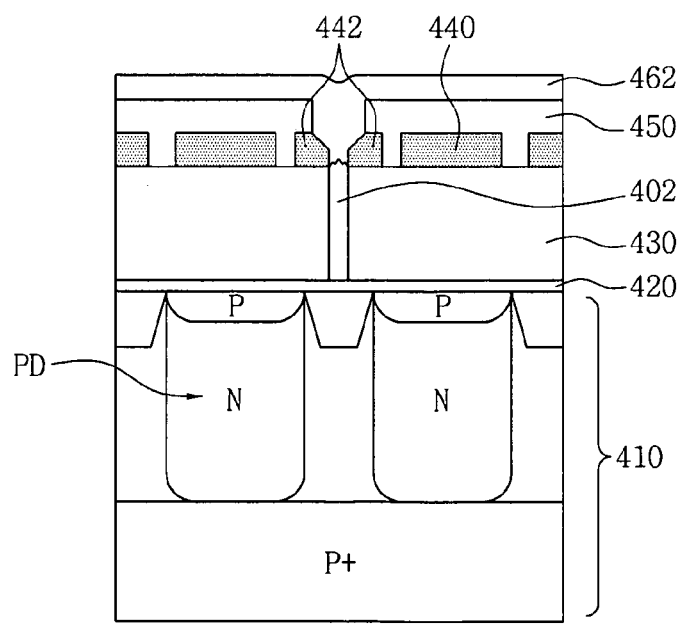
FIG. 18 is a cross-sectional view illustrating a process of filling only an upper portion of the trench with gap-fill oxide according to yet another example embodiment.

Referring to FIG. 18, a oxide 462 may be formed on the IMD 450 having the trench. The oxide 462 may have a poor step coverage characteristic and a poor gap-fill characteristic. The oxide 462 may be PEOX or PE-TEOS.

Referring to FIG. 19, a plurality of dielectric layers and a plurality of interconnection patterns may be further formed on the gap-fill oxide 462. Like in the above-described example embodiments, a sustain wafer 470 may be formed on the front surface of the Si substrate 410 to facilitate the processing of a rear surface of the Si substrate 410, and an ARL 480 for required or alternatively preventing reflection of light, an oxide layer 482 for forming a pad metal layer, R, G, and B color filters 484, a planarization layer 486, and MLs 488 for condensing light may be sequentially installed on the back-lapped rear surface of the Si substrate 410, thereby completing the manufacture of an image sensor 400.

As explained in example embodiments, as the pixel area of an image sensor decreases and a distance between PDs decreases, crosstalk between adjacent PDs may frequently occur due to a reflection plate provided to maximize condensing efficiency. Thus, it becomes more necessary to guide light out of an adjacent pixel. As a result, an air gap functioning as a light guide may be provided. In order to form the air gap, an ILD may be deposited to a required or alternatively predetermined depth on a semiconductor substrate having the PDs. Thereafter, a metal layer may be formed and patterned to form a reflection pattern, an interconnection pattern, and a dummy pattern. The ILD may be removed to a required or alternatively predetermined depth using the reflection pattern, the interconnection pattern, and the dummy pattern as an etch mask to form a trench. Afterwards, only an upper portion of the trench may be filled with a gap-fill oxide having a good step coverage characteristic to maintain a lower portion of the trench void.

As described above in example embodiments, the following effects can be expected.

First, since light condensed on a lens is not transmitted through a plurality of interconnection layers but directly irradiated to a rear surface of a light receiving unit, the sensitivity of the light receiving unit may be improved, and light passing through a PD may be reflected by a reflection pattern and reabsorbed in the PD. As a result, the sensitivity of the light receiving unit may be further improved.

Second, the reflection pattern and an interconnection pattern are formed using the same process, thereby reducing the number of processes.

Third, a dielectric layer may be etched to a required or alternatively predetermined depth using the reflection pattern and the interconnection pattern as an etch mask to form a trench, and only an upper portion of the trench may be filled with oxide having a poor gap-fill characteristic. Thus, an air gap may be maintained airtight, and a total reflection function of the air gap may be maximized.

Fourth, because the air gap functions as a light guide, crosstalk may be reduced or alternatively prevented. Thus improving not only the condensing efficiency of an image sensor but also the sensitivity of the image sensor.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of manufacturing an image sensor, comprising:
   forming a photoelectric conversion device in a substrate;
   forming an etch stop layer on the photoelectric conversion device, the etch stop layer covering a front surface of the substrate;
   forming an insulating layer on the etch stop layer;
   forming a first metal layer on the insulating layer;
   etching the first metal layer to form a reflection pattern and a first interconnection pattern on the first insulating layer, the first interconnection pattern being spaced apart from the reflection pattern, wherein the reflection pattern is vertically aligned with the photoelectric conversion device and is formed above a central region of the photoelectric conversion device, and the first interconnection pattern is not vertically aligned with the photoelectric conversion device;
   forming an air gap in the insulating layer between the reflection pattern and the first interconnection pattern, wherein the air gap partially exposes a surface of the etch stop layer; and
   forming a gap-fill oxide covering the reflection pattern and the first interconnection pattern, and filling an upper portion of the air gap.

2. The method of claim 1, further comprising:
   forming a dielectric layer on the gap-fill oxide; and
   forming a second metal layer on the dielectric layer to form a second interconnection pattern.

3. The method of claim 2, further comprising:
   forming an anti-reflective layer beneath a rear surface of the substrate;
   forming an oxide beneath the anti-reflective layer;
   forming a color filter beneath the oxide;
   forming a planarized layer beneath the color filter; and
   forming a microlens beneath the planarized layer.

4. The method of claim 1, further comprising:
   forming a field oxide layer in the substrate, the field oxide layer being formed at side of the photoelectric conversion device.

5. The method of claim 4, the first interconnection pattern is vertically aligned with the field oxide layer.

6. The method of claim 4, wherein the air gap is vertically aligned with the field oxide layer.

7. The method of claim 1, wherein the reflection pattern has an isolated rectangular shape.

8. A method of manufacturing an image sensor, comprising:
   forming photoelectric conversion devices in a substrate;
   forming an etch stop layer on the photoelectric conversion devices, the etch stop layer covering a front surface of the substrate;
   forming an insulating layer on the etch stop layer;
   forming reflection patterns and a first interconnection pattern between the reflection patterns on the insulating layer, the reflection patterns being vertically aligned with the photoelectric conversion devices, respectively, and being formed above central regions of the photoelectric conversion devices, respectively;
   forming trenches by removing portions of the insulating layer, the portions of the insulating layer being vertically aligned between the reflection patterns and the interconnection pattern; and
   forming a gap-fill oxide to form air gaps, the gap-fill oxide covering the reflection pattern and the first interconnection pattern, and filling an upper portion of the trenches.

9. The method of claim 8, wherein the trenches exposes the etch stop layer.

10. The method of claim 8, wherein the first interconnection pattern is vertically aligned between the trenches.

11. A method of manufacturing an image sensor, comprising:
    forming a first insulating layer on a substrate, the substrate including a plurality of pixels having photoelectric conversion devices, respectively;
    forming a metal layer on the first insulating layer;
    patterning the metal layer to form first metal patterns, second metal patterns and third metal patterns,
    wherein the first metal patterns are formed above central regions of the photoelectric conversion devices, respectively, and the second metal patterns and the third metal patterns are formed between the first metal patterns;
    forming a second insulating layer on the first insulating layer, the second insulating layer covering the first metal patterns, the second metal patterns and the third metal patterns;
    patterning the first insulating layer and the second insulating layer to form trenches passing through the first insulating layer and the second insulating layer, the trenches being formed between the second metal patterns and between the third metal patterns, respectively; and
    forming a third insulating layer on the second insulating layer to form air gaps in the trenches, the third insulating layer covering the trenches.

12. The method of claim 11, wherein each of the first metal patterns is formed in a box type.

13. The method of claim 12, wherein two of the second metal patterns are formed between two of the first metal patterns and line types in a first direction.

14. The method of claim 13, wherein two of the third metal patterns are formed between two of the first metal patterns and isolated line types in a second direction perpendicular to the first direction.

15. The method of claim 11, wherein each of the trenches has a first width in the first insulating layer and a second width different from the first width in the second insulating layer.

16. The method of claim 15, wherein the first width is smaller than that the second width.

17. The method of claim 16, further comprising:
    forming a field oxide layer between the photoelectric conversion devices in the substrate, wherein the trenches are vertically aligned with the field oxide layer.

18. The method of claim 11, wherein the third insulating layer is inserted into the second insulating layer to fill upper portions of the trenches.

19. The method of claim 11, further comprising:
forming an anti-reflective layer beneath a rear surface of the substrate,
forming a fourth insulating layer beneath the anti-reflective layer,
forming color filters beneath the fourth insulating layer,
forming a fifth insulating layer beneath the color filters, and
forming microlenses beneath the fifth insulating layer,
wherein the microlenses are vertically aligned with the color filters, respectively.

20. The method of claim 19, wherein the first metal patterns are vertically aligned with the color filters, respectively.

* * * * *